(12) United States Patent
Wang et al.

(10) Patent No.: US 6,622,374 B1
(45) Date of Patent: Sep. 23, 2003

(54) RESISTOR COMPONENT WITH MULTIPLE LAYERS OF RESISTIVE MATERIAL

(75) Inventors: Jiangtao Wang, Cleveland Heights, OH (US); Michael A. Centanni, Parma, OH (US); Sidney J. Clouser, Chardon, OH (US)

(73) Assignee: Gould Electronics Inc., Eastlake, OH (US)

(*) Notice: Subject to any disclaimer, the term of this patent is extended or adjusted under 35 U.S.C. 154(b) by 0 days.

(21) Appl. No.: 09/667,294

(22) Filed: Sep. 22, 2000

(51) Int. Cl.⁷ .................. H01F 17/075; H01F 17/06
(52) U.S. Cl. .................. 29/620; 29/610.1; 29/621; 29/847; 29/DIG. 16; 427/101; 338/307; 338/308; 338/314
(58) Field of Search .................. 29/610.1, 619, 29/620, 621, 832, 847, DIG. 16; 338/307, 308, 309, 320, 314; 427/101

(56) References Cited

U.S. PATENT DOCUMENTS

| | | | |
|---|---|---|---|
| 2,662,957 A | 12/1953 | Eisler | 201/73 |
| 3,368,919 A * | 2/1968 | Casle | 117/217 |
| 3,489,656 A | 1/1970 | Balde | 204/15 |
| 3,621,442 A * | 11/1971 | Racht | 338/309 |
| 3,742,120 A * | 6/1973 | Keister | 174/68.5 |
| 3,833,410 A * | 9/1974 | Ang et al. | 427/101 X |
| 3,849,757 A * | 11/1974 | Khammous | 338/320 |
| 3,857,683 A | 12/1974 | Castonguay | 29/195 |
| 3,864,825 A | 2/1975 | Holmes | 29/621 |
| 4,164,607 A * | 8/1979 | Thiel | 428/621 |
| 4,203,025 A * | 5/1980 | Nakatani | 219/216 |
| 4,396,900 A * | 8/1983 | Hall | 338/309 |
| 4,482,882 A * | 11/1984 | Liider | 338/34 |
| 4,503,112 A | 3/1985 | Konicek | 428/216 |
| 4,517,546 A | 5/1985 | Kakuhashi et al. | 338/320 |
| 4,585,537 A | 4/1986 | Nakayama et al. | |
| 4,617,575 A * | 10/1986 | Fuyama et al. | 346/76 |
| 4,892,776 A | 1/1990 | Rice | 428/209 |
| 5,038,132 A | 8/1991 | Lindblom et al. | 338/307 |
| 5,039,570 A | 8/1991 | Sturm | 428/209 |
| 5,128,008 A | 7/1992 | Chen et al. | 204/192.15 |
| 5,172,473 A | 12/1992 | Burns et al. | 29/885 |
| 5,243,320 A | 9/1993 | Clouser et al. | 338/308 |
| 5,389,446 A | 2/1995 | Yamanishi et al. | 428/472 |
| 5,661,902 A * | 9/1997 | Katchmar | 29/832 X |
| 5,689,227 A | 11/1997 | Nguyen et al. | 338/308 |
| 5,709,957 A | 1/1998 | Chiang et al. | 428/615 |
| 5,863,666 A | 1/1999 | Merchant et al. | 428/544 |
| 5,908,544 A | 6/1999 | Lee et al. | 205/316 |

FOREIGN PATENT DOCUMENTS

| | | | |
|---|---|---|---|
| EP | 0 007 598 | 2/1980 | H01C/7/00 |
| EP | 0 452 812 | 10/1991 | |
| EP | 0 540 820 | 5/1993 | |
| GB | 690691 | 4/1953 | |
| JP | 58095301 | 6/1983 | |
| JP | 1-298796 * | 12/1989 | 29/610.1 |
| JP | 406120630 A | 4/1994 | |
| JP | 08235540 | 9/1996 | |

OTHER PUBLICATIONS

"Structure and Magnetic Properties of FE1–XNIX/CU Invar Superlattics," Tang et al., Journal of Applied Physics, US, American Institute of Physics, New York, vol. 80, No. 4, Aug. 15, 1996, pp. 2327–2333, XP000633333.

"Transmission Electron Microscope Study of Thin Cu–Ni Laminates Obtained by Vapor Deposition," Nakahara et al., International Conference on Metallurgical Coatings, San Diego, CA, US, Apr. 21–25, 1980, vol. 72, No. 2, pp. 277–284, XP000993586.

* cited by examiner

*Primary Examiner*—A. Dexter Tugbang
(74) *Attorney, Agent, or Firm*—Mark Kusner; Michael A. Jaffe

(57) ABSTRACT

A method of manufacturing a resistor foil, comprised of a copper layer having a first side and a second side. A tiecoat metal layer having a thickness of between 5 Å and 70 Å is disposed on the first side of the copper layer. A first layer of a first resistor metal having a thickness of between 100 Å and 500 Å is disposed on the tiecoat metal layer, and a second layer of a second resistor metal having a thickness of between 100 Å and 500 Å is disposed on the first layer of the first resistor metal. The first resistor metal has a resistance different from the second resistor metal.

12 Claims, 4 Drawing Sheets

RESISTOR COMPONENT WITH MULTIPLE LAYERS OF RESISTIVE MATERIAL

FIELD OF THE INVENTION

The present invention relates to multi-layer printed circuit boards and, more particularly, to a resistive component usable in forming boards with embedded resistive layers.

BACKGROUND OF THE INVENTION

A basic component of a printed circuit board is a dielectric layer having a sheet of copper foil bonded thereto. Through a subtractive process that includes one or more etching steps, portions of the copper foil are etched away to leave a distinct pattern of conductive lines and formed elements on the surface of the dielectric layer. Multi-layer printed circuit boards are formed by stacking and joining two or more of the aforementioned dielectric layers having printed circuits thereon. Many printed circuit boards include conductive layers containing patterned components that perform like specific, discreet components. One such discreet component is a resistive element formed from a resistor foil. A resistor foil is basically a copper foil having a thin layer of resistive material, typically a metal or metal alloy deposited onto one surface thereof. The resistor foil is attached to a dielectric substrate with the resistive material adhered to the dielectric substrate. Using conventionally known masking and etching techniques, the copper foil and resistive material are etched away to produce a trace line of copper with the resistive material therebelow on the surface of the dielectric. A section of the copper layer is removed leaving only the resistive material on the surface connecting the two separated ends of the copper. Because the material forming the resistive layer typically has a conductivity less than copper, it essentially acts as a resistor between the separated ends of the copper trace lines. The thickness and width of the resistive layer, as well as the length of the resistive layer disposed between the ends of the copper traces, affect the resistance of the resistive element so formed.

The present invention represents an improvement over resistor foils known heretofore and provides a resistor foil having multiple layers of resistive material on a copper layer, thereby facilitating the formation of a variety of different resistive elements having a variety of resistance values.

SUMMARY OF THE INVENTION

In accordance with a preferred embodiment of the present invention, there is provided a resistor foil, comprised of a copper layer having a first side and a second side. A tiecoat metal layer having a thickness of between 5 Å and 70 Å is provided on the first side of the copper layer. A first layer of a first resistor metal having a thickness of between 100 Å and 500 Å is on the tiecoat metal layer, and a second layer of a second resistor metal having a thickness of between 100 Å and 500 Å is on the first layer of the first resistor metal. The first resistor metal has a resistance different from the second resistor metal.

In accordance with another embodiment of the present invention, there is provided a method of forming a resistive element on a printed circuit board, comprising the steps of:

a) adhering a resistor foil to a dielectric substrate, the resistor foil comprised of:
   a copper layer having a first side and a second side;
   a tiecoat metal layer having a thickness of between 5 Å and 70 Å on the first side of the copper layer;
   a first layer of a first resistor metal on the tiecoat metal layer; and
   a second layer of a second resistor metal on the first layer of the first resistor metal, the first resistor metal having a resistance different from the second resistor metal, the resistor foil adhered to the substrate with the second layer of the second resistor metal facing the dielectric substrate;

b) forming a circuit trace line on the dielectric substrate from the resistor foil; and c) removing a portion of the copper layer and the tiecoat metal layer from the circuit trace line to define a section of the circuit trace line comprised of the first and second layer of resistor metals.

These and other objects will become apparent from the following description of a preferred embodiment taken together with the accompanying drawings and the appended claims.

BRIEF DESCRIPTION OF THE DRAWINGS

The invention may take physical form in certain parts and arrangement of parts, a preferred embodiment of which will be described in detail in the specification and illustrated in the accompanying drawings which form a part hereof, and wherein.

DETAILED DESCRIPTION OF PREFERRED EMBODIMENT

The present invention relates to a resistor foil for use in forming embedded resistive elements in printed circuit boards. Broadly stated, the resistor foil is formed of a resistive copper foil having two or more layers of resistive material applied thereto. The resistive materials are preferably formed of metal. As used herein, the term "metal" refers to metals and alloys capable of vacuum deposition by the methods discussed herein.

The copper foils used with this invention can be made using one of two techniques. Wrought or rolled copper foil is produced by mechanically reducing the thickness of a copper or copper alloy strip or ingot by a process such as rolling. Electrodeposited foil is produced by electrolytically depositing from solution copper ions on a rotating cathode drum and then peeling the deposited foil from the cathode. Electrodeposited copper foils find advantageous application with this invention.

The copper foils typically have nominal thicknesses ranging from about 0.0002 inch to about 0.02 inch. Copper foil thickness is sometimes expressed in terms of weight and typically the foils of the present invention have weights or thicknesses ranging from about ⅛ to about 14 ounces per square foot (oz/ft²). Especially useful copper foils are those having weights of ⅓, ½, 1 or 2 oz/ft².

Electrodeposited copper foils have a smooth or shiny (drum) side and a rough or matte (copper deposit growth front) side. The side or sides of the foil, to which the layer applied by the inventive process overlies, can be a "standard-profile surface," low-profile surface" or "very-low-profile surface." Useful embodiments involve the use of foils with low-profile surfaces and very low-profile surfaces. The term "standard-profile surface" is used herein to refer to a foil surface having a $R_{tm}$ (IPC-MF-150F) of greater than 10.2 $\mu$. The term "low-profile" refers to a foil surface having a $R_{tm}$ (IPC-MF-150F) of less than 10.2 $\mu$. The term "very-low-profile surface" refers to a foil surface having a $R_{tm}$ (IPC-MF-150F) of less than 5.1 $\mu$. $R_{tm}$ (IPC-MF-150F) is the mean of the maximum peak-to-valley vertical measurements from each of five consecutive sampling measurements, and can be measured using a SURTRONIC® 3 profilometer marketed by Rank Taylor Hobson, Ltd., Leicester, England.

The present invention finds advantageous application with copper foils of the type heretofore described.

Figure 1:
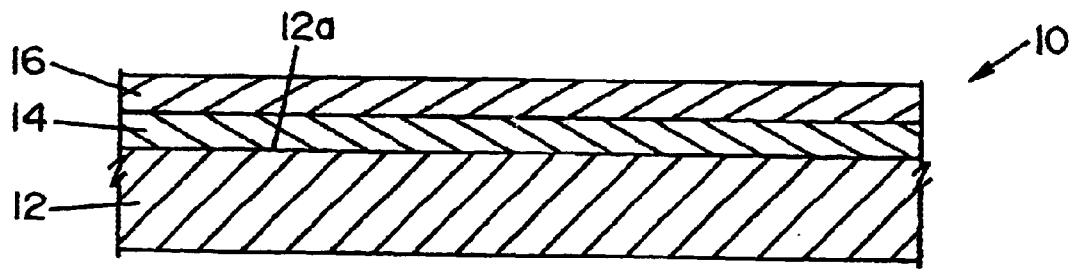
FIG. 1 is an enlarged, cross-sectional view of a resistor foil illustrating a preferred embodiment of the present invention.
Figure 2:
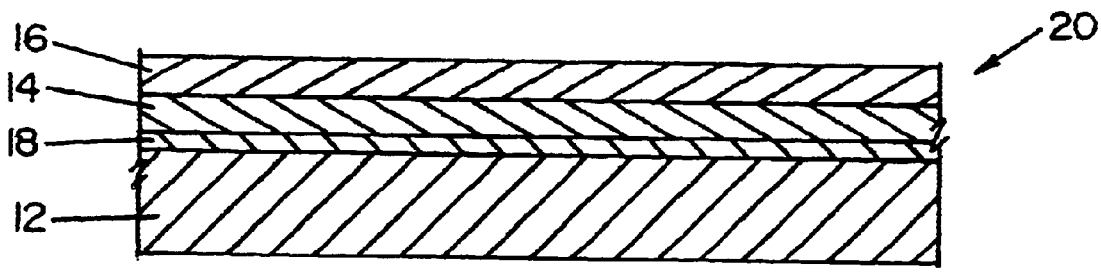
FIG. 2 is an enlarged, cross-sectional view of a resistor foil illustrating an alternate embodiment of the present invention.

Referring now to FIG. 1, a resistor foil 10, illustrating a preferred embodiment of the present invention is shown in cross-section. Resistor foil 10 is comprised of a copper layer 12. A first layer 14 of a first resistive material is applied to one side of copper layer 12. Layer 14 is preferably formed of a metal or metal alloy that is deposited onto copper layer 12 by a deposition process such as vacuum metalization, electrodeposition, electroless deposition or combinations thereof. Layer 14 is preferably applied to side 12a of copper layer 12 by an electrodeposition process or vacuum metalization. Layer 14 is formed of a metal having a resistivity greater than copper. Metals such as aluminum, zinc, nickel, nickel/chromium, nickel/chromium/aluminum/silicon alloy, titanium, vanadium, chromium, tantalum, iron, manganese and alloys, oxides, nitrides and suicides thereof, as well as any vapor depositable metal or alloy, oxide, nitride and silicide whose electrical resistivity is greater than that of copper, find advantageous application in forming layer 14. In a preferred embodiment, layer 14 is formed of a nickel/chromium/aluminum/silicon alloy. As layer 14 will ultimately be used to form a resistive element, the thickness of layer 14 will be based upon the resistivity of the metal forming layer 14 as well as the desired resistance of the resistive element to be formed. In this respect, layer 14 may have a thickness of between 100 Å and 500 Å, and more preferably between 100 Å and 350Å.

A second layer 16 of a second resistive material is applied onto layer 14. Layer 16 is preferably formed of a material different from that forming layer 14. The material forming layer 16 preferably has a resistivity different from the material forming layer 14, wherein layer 16 has a resistance different from layer 14.

Layer 16 may be formed from any of the same materials identified above i.e., aluminum, zinc, nickel, nickel/chromium, nickel/chromium/aluminum/silicon alloy, titanium, vanadium, chromium, tantalum, iron, manganese and alloys, oxides, nitrides and silicides thereof, as well as any vapor depositable metal or alloy, oxide, nitride and silicide whose electrical resistivity is greater than that of copper, subject to layer 16 having a resistance different from layer 14. In preferred embodiments, second layer 16 is formed of compounds of tantalum and oxygen, e.g., $Ta_2O_5$, compounds of tantalum and nitrogen, e.g., $Ta_2N$ and $TaN_2$, or compounds of chromium and silicon, e.g., CrSi.

Layer 16 is preferably applied by a deposition process such as vacuum metalization, electrodeposition, electroless deposition or combinations thereof. Layer 16 is preferably applied to layer 14 by an electrodeposition process or vacuum metalization.

As with layer 14, the thickness of layer 16 will be based upon the desired resistance of layer 16 and the resistance element to be formed, as well as on the material forming layer 16. In this respect, layer 16 may have a thickness of between 100 Å and 500 Å, and more preferably between 100 Å and 350 Å.

Figure 3:
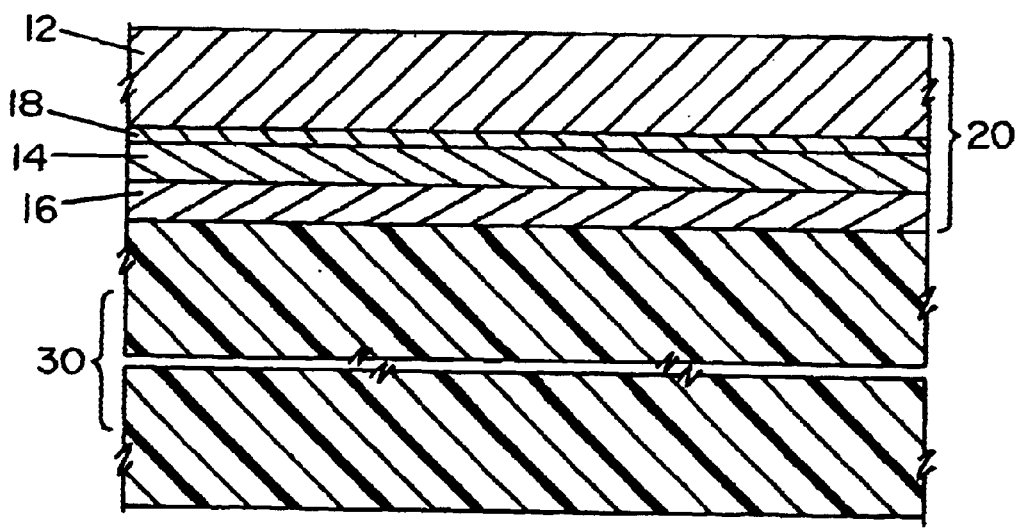
FIG. 3 is a cross-sectional view showing the resistor foils shown in FIG. 2 attached to a dielectric substrate.

Referring now to FIG. 3, a resistor foil 20, illustrating an alternate embodiment of the present invention is shown. Resistor foil 20 is similar to resistor foil 10, and like elements are designated with like reference numbers. Resistor foil 20 differs from resistor foil 10 in that a tiecoat layer, designated 18, is disposed between copper layer 12 and first layer 14. Tiecoat layer 18 is provided as an adhesion promoting layer to improve the adhesion of layer 14 to copper layer 12.

Tiecoat 18 may be formed of the following metals: nickel, palladium, titanium, tantalum, aluminum, iron, vanadium, chromium, chromium-based alloys and nickel-based alloys. A metal tiecoat layer 18 is applied to a clean surface of the copper. In a preferred embodiment, tiecoat layer 18 is comprised of chromium. The chromium tiecoat may be applied by a vacuum deposition process such as sputtering, e-beam deposition or thermal evaporation. Tiecoat 18 has a thickness greater than 5 Å. Preferably, the thickness of tiecoat 18 is between 5 Å and 70 Å, and more preferably, between about 10 Å and about 20 Å.

Referring now to the use of resistor foil 10 or resistor foil 20 in forming a resistive element, FIG. 3 shows resistor foil 20 adhered to a dielectric substrate 30. As will be appreciated from a further reading of the specification, the following discussion would also apply if resistor foil 10 is used. Resistor foil 20 may be secured to dielectric substrate 30 using an adhesive (not shown), or adhered to dielectric substrate 30 by a lamination process, wherein dielectric substrate 30 is cured with resistor foil 20 attached thereto. Methods of securing a resistor foil, such as foils 10 and 20 are conventionally known, and the particular method used in and of itself is not critical to the present invention.

Resistor foil 20 is attached to dielectric substrate 30 with second layer 16 closest to, and facing, substrate 30 (as shown in FIG. 3), and with copper layer 12 exposed. Using conventionally known processes of masking and etching, unwanted areas of resistor foil 20 are etched away to leave a circuit pattern (not shown) on the surface of dielectric substrate 30.

Figure 4:
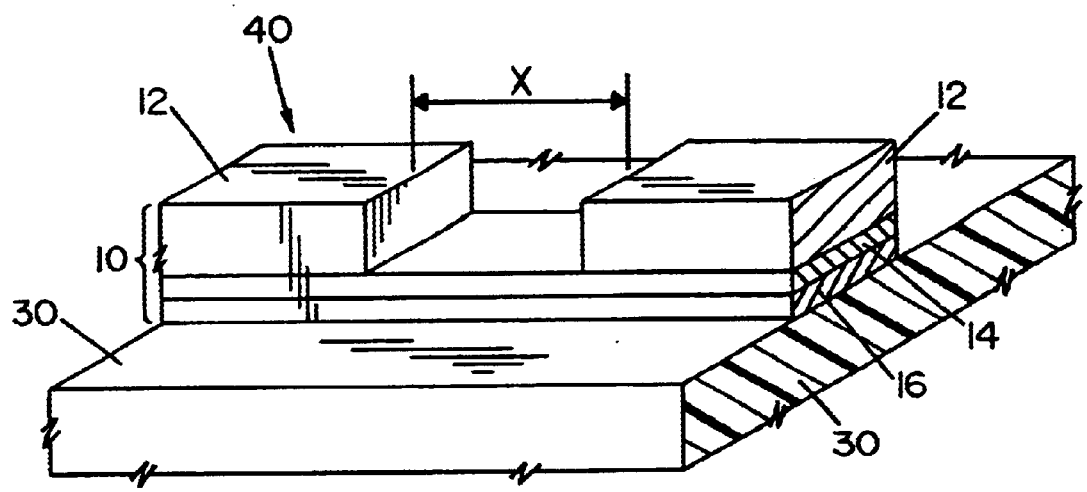
FIG. 4 is a perspective view of a resistive element formed from a resistor foil shown in FIG. 2.

FIG. 4 is a perspective view of a portion of a circuit showing a trace line 40 on substrate 30. A section, designated "X," of copper layer 12 is removed from trace line 40, by conventionally known masking and etching techniques, to leave only first and second layers 14, 16 of first and second resistor materials connecting the spaced-apart ends of copper layer 12. In other words, section X essentially forms a resistive element between the spaced-apart ends of copper layer 12 of trace line 40. Any current flow through trace line 40 must necessarily flow through first and second layers 14, 16 of section X. Since first layer 14 has a different resistance than second layer 16, the total resistance of section X is a function of both layers 14, 16.

Figure 4A:
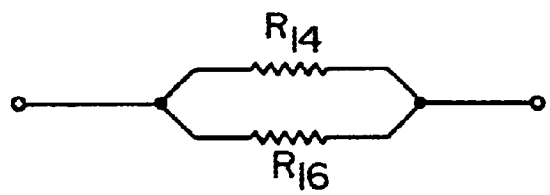
FIG. 4A is a schematic, electrical representation of the resistive element shown in FIG. 4.

FIG. 4A is an electrical, schematic representation of the resistance of section X. The resistive element shown in FIG. 4 is the equivalent of two resistors $R_{14}$, $R_{16}$ in parallel, where $R_{14}$ is the resistance of first layer 14 in section X and $R_{16}$ is the resistance of second layer 16 in section X. The total resistance, $R_{TOTAL}$, of the resistive element shown in FIG. 4 is determined by the following equation:

$$R_{TOTAL} = \frac{(R_{14})(R_{16})}{R_{14} + R_{16}}$$

Figure 5:
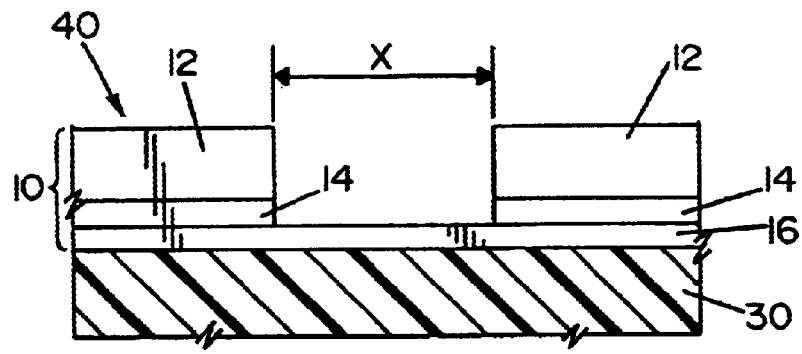
FIG. 5 is a partially sectioned, side elevational view of another resistive element shown in FIG. 2.
Figure 5A:
FIG. 5A is a schematic, electrical representation of the resistive element shown in FIG. 5.

FIG. 5 shows a variation to trace element 40, as shown in FIG. 4, that produces a different resistive element. In the embodiment shown in FIG. 5, first layer 14 is also etched away in section X (by conventional masking and etching techniques), leaving only second layer 16 in section X. The resistance of the element shown in FIG. 5 is a function of resistance $R_{16}$ of second layer 16 in section X. The resulting resistive element is equivalent to that schematically illustrated in FIG. 5A. FIGS. 4–5A thus show how two different resistive elements may be formed from the same resistor foil 10 by merely changing the number of layers removed, i.e., etched away, from trace line 40.

Figure 6:
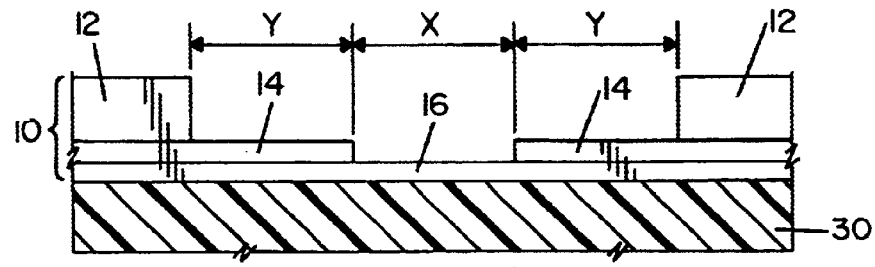
FIG. 6 is a partially sectioned, side elevational view of a still further type of resistive element formed using the resistor foil shown in FIG. 2.
Figure 6A:
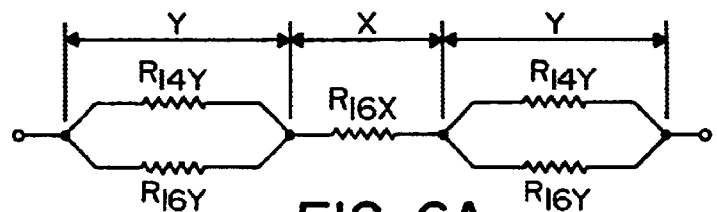
FIG. 6A is a schematic, electrical representation of the resistive element shown in FIG. 6.

FIGS. 6 and 6A show still another embodiment of a resistive element that may be formed from resistor foil 10. In the embodiment shown in FIG. 6, resistor foil 10 has been masked and etched to form a trace line (shown in cross-section in FIG. 6) and the trace line masked and etched to form a resistive element having a central section "X" and two sections "Y" adjacent thereto. In section X, only second layer 16 remains. In sections Y, both first and second layers 14 and 16 remain.

The resistance of the resultant structure is shown in FIG. 6A, wherein the resistance of sections Y are equivalent to two resistors $R_{14Y}$ and $R_{16Y}$ in parallel, wherein $R_{14Y}$ is the resistance of first layer 14 in section Y and $R_{16Y}$ is the resistance of second layer 16 in section Y. The resistance of section X is $R_{16X}$ which is the resistance of second layer 16 in section X. The total resistance of the structure shown in FIGS. 6 and 6A is the sum of the resistances of each section.

Figure 7:
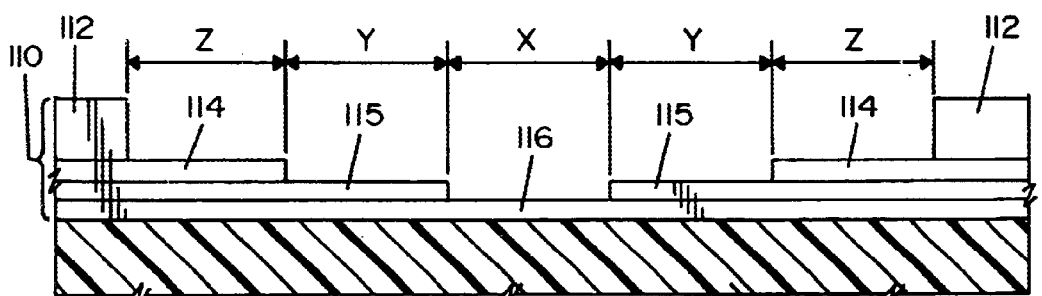
FIG. 7 is a cross-sectional view of a resistive element formed from a resistor foil having three layers of resistive material thereon, illustrating another embodiment of the present invention.
Figure 7A:
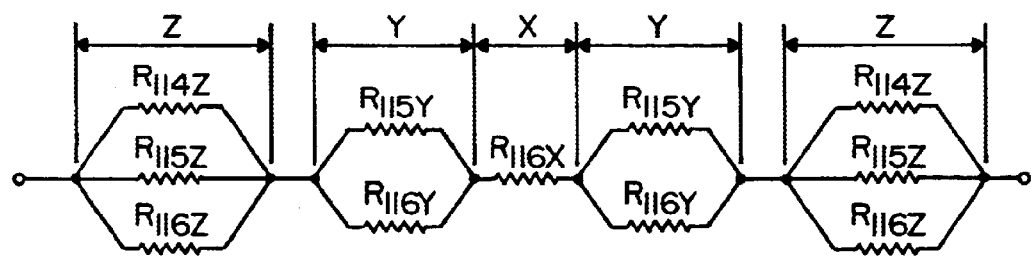
FIG. 7A is a schematic, electrical representation of the resistive element shown in FIG. 7.

The resistive elements heretofore described were formed with a resistor foil 10 having two layers of resistive materials thereon, i.e., first layer 14 and second layer 16. FIG. 7 shows a cross-sectional view of a resistive element formed from a resistor foil 110 having three layers of resistor material thereon. Resistor foil 110 has a copper layer 112, a first layer 114 of a first resistive material, a second layer 115 of a second resistive material and a third layer 116 of a third resistive material. Each resistive material has a different resistivity such that each layer 114, 115 and 116 has a different resistance value. Resistor foil 110 is masked and etched to produce a central zone "X" comprised of layer 116, intermediate sections "Y" comprised of layers 115 and 116 and outer sections "Z" comprised of layers 114, 115 and 116. As shown in FIG. 7A, and like the structures previously discussed, the resistance of the structure shown in FIG. 7 is the sum of resistance of each of sections X, Y and Z, and the resistance of sections Y and Z are determined by the respective resistances of layers 114, 115 and 116 in parallel. FIG. 7 thus illustrates that a resistor foil having more than two resistive layers may be formed and a variety of different resistor values can be created.

Figure 8:
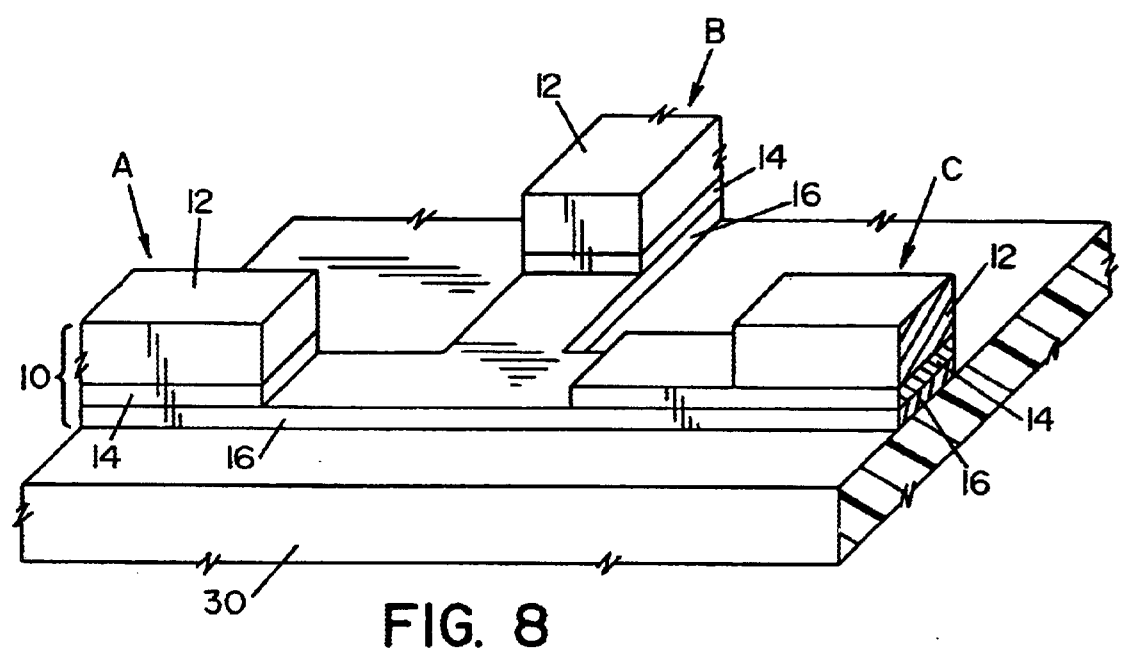
FIG. 8 is a perspective view of a resistive element formed from the resistor foil shown in FIG. 2, illustrating another embodiment of the present invention.

Heretofore, single trace lines having resistive elements formed therein have been described. FIG. 8 illustrates how a circuit having a junction of three branches, designated A, B and C, can be formed from resistor foil 10. FIG. 8 illustrates how multiple branch trace lines having one or more branches with different resistances may be formed.

The foregoing description discloses specific embodiments of the present invention. These embodiments are described for purposes of illustration only. Numerous alterations and modifications may be practiced by those skilled in the art without departing from the spirit and scope of the invention. It is intended that all such modifications and alterations be included insofar as they come within the scope of the invention as claimed or the equivalents thereof.

Having described the invention, the following is claimed:

1. A method of forming a discrete resistive element of a printed circuit board, comprising the steps of:
   a) adhering a resistor foil to a dielectric substrate of the printed circuit board, said resistor foil comprised of:
      a copper layer having a first side and a second side;
      a tiecoat metal layer having a thickness of between 5 Å and 70 formed on said first side of said copper layer.
      a first layer of a first resistor metal formed directly on said tiecoat metal layer; and
      a second layer of a second resistor metal formed on said first layer of said first resistor metal, said first resistor metal having a resistance different from said second resistor metal, said resistor foil adhered to said substrate with said second layer of said second resistor metal facing said dielectric substrate;
   b) forming a circuit trace line of the printed circuit board on a surface of said dielectric substrate by etching away unwanted areas of said resistor foil leaving a section of said resistive foil consisting solely of at least one of (a1) said first layer of said first resistor metal and (b1) said second layer of said second resistor metal, thereby forming the discrete resistive element of the printed circuit board.

2. A method as defined in claim 1, wherein said first resistor metal is selected from the group consisting of aluminum, zinc, nickel, nickel/chromium, nickel/chromium/aluminum/silicon alloy, titanium, vanadium, chromium, tantalum, iron, manganese and alloys, oxides, nitrides and silicides thereof.

3. A method as defined in claim 2, wherein said second resistor metal is selected from the group consisting of aluminum, zinc, nickel, nickel/chromium, nickel/chromium/aluminum/silicon alloy, titanium, vanadium, chromium, silicon, tantalum, iron, manganese and alloys, oxides, nitrides and silicides thereof.

4. A method as defined in claim 3, wherein said first resistor metal is different from said second resistor metal.

5. A method as defined in claim 4, wherein said first resistor metal is a nickel/chromium alloy.

6. A method as defined in claim 5, wherein said second resistor metal is comprised of a compound of tantalum and oxygen.

7. A method as defined in claim 5, wherein said second resistor metal is comprised of a compound of chromium and silicon.

8. A method as defined in claim 5, wherein said second resistor metal is comprised of a compound of tantalum and nitrogen.

9. A method as defined in claim 4, wherein said first resistor metal is nickel/chromium/aluminum/silicon alloy.

10. A method as defined in claim 9, wherein said second resistor metal is comprised of a compound of chromium and silicon.

11. A method as defined in claim 9, wherein said second resistor metal is comprised of a compound of tantalum and nitrogen.

12. A method as defined in claim 9, wherein said second resistor metal is comprised of a compound of tantalum and oxygen.

* * * * *